US006496355B1

United States Patent
Galvagni et al.

(10) Patent No.: US 6,496,355 B1
(45) Date of Patent: Dec. 17, 2002

(54) INTERDIGITATED CAPACITOR WITH BALL GRID ARRAY (BGA) TERMINATIONS

(75) Inventors: John L. Galvagni, Surfside Beach, SC (US); Andrew P. Ritter, Surfside Beach, SC (US); Thomas Brown, Myrtle Beach, SC (US)

(73) Assignee: AVX Corporation, Myrtle Beach, SC (US)

(*) Notice: Subject to any disclaimer, the term of this patent is extended or adjusted under 35 U.S.C. 154(b) by 0 days.

(21) Appl. No.: 09/971,538

(22) Filed: Oct. 4, 2001

(51) Int. Cl.$^7$ ............................................. H01G 4/228
(52) U.S. Cl. ................................................... 361/306.3
(58) Field of Search ............................ 361/303, 306.1, 361/306.3, 321.2, 760, 809; 174/260, 261

(56) References Cited

U.S. PATENT DOCUMENTS

| 4,409,608 A | 10/1983 | Yoder |
| 4,866,567 A | 9/1989 | Crafts et al. |
| 5,442,852 A | 8/1995 | Danner |

(List continued on next page.)

OTHER PUBLICATIONS

*Controlling Capacitor Parasitics for High Frequency Decoupling*, by George Korony, Andrew Ritter, Carlos Gonzalez–Titman, Joseph Hock, John Galvagni and Robert Heistand II; presented IMAPS 2001, the 34$^{th}$ International Symposium on Microelectronics. Oct. 9–11, 2001 Baltimore, Maryland.
*Distributed SPICE Circuit Model for Ceramic Capacitors*, by Larry Smith and David Hockanson; presented Electronic Components and Technology Conference. May 29–Jun. 1, 2001.

*Technical Information: A Passive Component Approach to Faster, Better, and Cheaper*, by Chris Reynolds; posted on corportate website www.avxcorp.com/TechInfo_catlisting.asp. Mar. 2000 Myrtle Beach, SC.
*Technical Information: Interconnect Schemes for Low Inductance Ceramic Capacitors*, by Jeff Cain, Ph.D.; posted on corporate website www.avxcorp.com/TechInfo_catlisting.asp. Apr., 1999 Myrtle Beach, SC.

(List continued on next page.)

*Primary Examiner*—Anthony Dinkins
(74) *Attorney, Agent, or Firm*—Dority & Manning

(57) ABSTRACT

An improved low inductance capacitor and corresponding termination scheme is disclosed for grid array capacitors. The disclosed technology provides an interdigitated capacitor (IDC) capable of attaching ball grid array (BGA) terminated actives. The arrangement generally includes interleaved dielectric and electrode layers in an interdigitated configuration. Peripheral termination lands are then applied to the sides of the multilayer configuration to form electrical connections to exposed portions of the electrode layers. Selected edges of this IDC device are then preferably coated with a solder-stop material, thus providing a ball limiting metallurgy on the larger surfaces of the chip capacitor. Solder preforms may be applied directly to the peripheral terminations lands, providing a ball grid array (BGA) packaged chip ready to mount on a printed wire board and reflow. Composition of such solder balls is easily varied to comply with specific firing conditions. Such capacitor chips are also compatible with land grid array (LGA) packaging techniques. The interdigitated electrode design of the subject invention may be utilized to form a single multilayer capacitor or multiple discrete capacitors. Such a capacitor array may be formed by retaining the external configuration and internally subdividing the electrodes. The resulting low cost, low inductance capacitor is ideal for many high frequency applications requiring decoupling capacitors.

29 Claims, 6 Drawing Sheets

U.S. PATENT DOCUMENTS

| | | | |
|---|---|---|---|
| 5,473,512 A | * 12/1995 | Degani et al. | 361/760 |
| 5,504,277 A | 4/1996 | Danner | |
| 5,516,030 A | 5/1996 | Denton | |
| 5,519,580 A | 5/1996 | Natarajan et al. | |
| 5,583,359 A | 12/1996 | Ng et al. | |
| 5,594,275 A | 1/1997 | Kwon et al. | |
| 5,637,832 A | 6/1997 | Danner | |
| 5,641,113 A | 6/1997 | Somaki et al. | |
| 5,642,265 A | 6/1997 | Bond et al. | |
| 5,661,450 A | 8/1997 | Davidson | |
| 5,666,272 A | 9/1997 | Moore et al. | |
| 5,717,245 A | 2/1998 | Pedder | |
| 5,724,728 A | 3/1998 | Bond et al. | |
| 5,767,447 A | * 6/1998 | Didderar et al. | 174/52.4 |
| 5,787,580 A | 8/1998 | Woo | |
| 5,821,827 A | 10/1998 | Mohwinkel et al. | |
| 5,855,323 A | 1/1999 | Yost et al. | |
| 5,864,470 A | 1/1999 | Shim et al. | |
| 5,872,399 A | 2/1999 | Lee | |
| 5,880,921 A | 3/1999 | Tham et al. | |
| 5,880,925 A | 3/1999 | DuPre et al. | |
| 5,892,245 A | 4/1999 | Hilton | |
| 5,892,290 A | 4/1999 | Chakravorty et al. | |
| 5,893,724 A | 4/1999 | Chakravorty et al. | |
| 5,905,633 A | 5/1999 | Shim et al. | |
| 5,973,391 A | 10/1999 | Bischoff et al. | |
| 6,064,108 A | 5/2000 | Martinez | |
| 6,097,609 A | 8/2000 | Kabadi | |
| 6,114,756 A | 9/2000 | Kinsman | |

OTHER PUBLICATIONS

*Technical Information: The need for Low Inductance Capacitors*, by John Galvagni Sara Randall, Paul Roughan and Allen Templeton; posted on corporate websitewww.avx-corp.com/TechInfo_catlisting.asp. Jul. 1994 Myrtle Beach, SC.

*Technical Information: Low Inductance Capacitors for Digital Circuits*, by John Galvagni;posted on corporate website www. avxcorp.com/TechInfo_catlisting.asp. Mar. 1992 Myrtle Beach, CA.

* cited by examiner

INTERDIGITATED CAPACITOR WITH BALL GRID ARRAY (BGA) TERMINATIONS

BACKGROUND OF THE INVENTION

The present subject matter generally concerns a multilayer decoupling capacitor characterized by low inductance, and more particularly concerns such a multilayer capacitor with interdigitated electrode layer portions as well as ball grid array (BGA) terminations.

Integrated circuits (ICs) have been implemented for some time, but many specific features of these ICs affect the design criteria for electronic components and corresponding procedures for mounting such components. With increased functionality of integrated circuit components, the design of electronic components must become increasingly more efficient. The miniaturization of electronic components is a continuing trend in the electronics industry, and it is of particular importance to design parts that are sufficiently small, yet simultaneously characterized by high operating quality. Components are desired that are small in size and that have reliable performance characteristics, yet can also be manufactured at relatively low costs.

Component miniaturization enables higher density mounting on circuit boards or other foundations. Thus the spacing between components is also a limiting factor in present integrated circuit designs. Since spacing is such a critical design characteristic, the size and location of termination means or elements for IC components is also a significant design characteristic.

One specific electronic component that has been used in IC applications is the decoupling capacitor. Decoupling capacitors are often used to manage electrical noise problems that occur in circuit applications. They provide stable, local charge sources required to switch and refresh the logic gates used in present digital circuits. A dramatic increase in the speed and packing density of integrated circuits requires advancements in decoupling capacitor technology. When high-capacitance decoupling capacitors are subjected to the high frequencies of many present applications, performance characteristics become increasingly more important. One way to achieve improved performance is by lowering the inductance of the device. Thus, it is ideal that such capacitive structures provide low equivalent series inductance (ESL) in order to maintain circuit efficiency.

Several design aspects have been implemented that reduce the self and mutual inductance of decoupling capacitors. Reducing the current path will lower self inductance. Since the current often has to travel the entire length of the capacitor, termination on the longer ends of the structure will reduce the current path. If the current in adjacent capacitor electrodes flows in opposite directions it will reduce the mutual inductance in a capacitor. Multiple terminations as utilized in interdigitated capacitor technology lowers the inductance value.

Another approach to lowering the ESL of a decoupling capacitor is to minimize interconnect induction that results from termination configurations and mounting systems. Typical termination schemes incorporate long traces to the capacitor electrode pads. Such a connection is characterized by high inductance and often prohibits very close spacing between components. Thus, a more efficient termination is desired that has low ESL and that facilitates high component density for integrated circuits. It is also ideal to provide such an efficient termination scheme without decreasing the volumetric efficiency of the component.

Yet another contribution to lowering the ESL of a decoupling capacitor lies in reducing the current path between a ground plane or power plane in an integrated circuit to the electrode plates in a multilayer capacitor configuration. Typical multilayer capacitor designs require relatively thick cover layers on both top and bottom of such a multilayer configuration. These protective layers ideally provide sufficient bulk to withstand the stress of typical glass/metal frit that must be fired to a capacitor body. This typical need for protective outer layers hinders potential reduction of loop inductance.

In the context of decoupling capacitors, it is often ideal to incorporate other design characteristics based on specific applications. Customers of capacitor manufacturers often specify such choices, including capacitor packaging configuration and termination composition. In particular, it is convenient to have capacitors that can encompass either land grid array or area grid array designs. It will be appreciated throughout the remainder of this disclosure that a land grid array design corresponds to attachments located on the periphery of given surface of a component package; alternatively, an area grid array design corresponds to attachments distributed to form a matrix-type configuration over an entire given surface (periphery and internal regions thereof), of a component package. It is ideal to incorporate such options into a capacitor design in a cost-effective and convenient manner.

While examples of various aspects and alternative embodiments are known in the field of multilayer decoupling capacitors, no one design is known that generally encompasses all of the above-referenced preferred capacitor characteristics.

U.S. Pat. No. 6,064,108 shows an example of a multilayer capacitor that incorporates an arrangement of "interdigitated" capacitor plates. Such '108 patent represents an exemplary electrode configuration that enables reliable high-capacitance multilayer devices.

U.S. Pat. No. 5,661,450 discloses resistor arrays with low inductance termination schemes. Such arrays include conductive vias through a substrate with attached solder balls. This configuration is exemplary of a design that achieves low inductance connections for an integrated circuit environment.

U.S. Pat. Nos. 5,666,272 and 5,892,245 disclose examples of ball grid array (BGA) packages that facilitate increased component density on circuit boards.

U.S. Pat. No. 6,097,609 shows an exemplary packaging assembly that is compatible with both ball grid array (EGA) and land grid array (LGA) design configurations.

U.S. Pat. No. 5,880,925 discloses an exemplary multilayer capacitor with an interdigitated arrangement of lead structures.

Japanese Patent Nos. 7-37756, and 737795 reference capacitor arrays capable of high density component packaging.

Additional patents provide varied examples of capacitor designs, as follows.

| U.S. PAT. NO.: | INVENTOR: | ISSUE DATE | TITLE: |
| --- | --- | --- | --- |
| 6,114,756 | Kinsman | 09/05/2000 | INTERDIGITATED CAPACITOR DESIGN FOR INTEGRATED CIRCUIT LEADFRAMES |
| 5,973,391 | Bischoff et al. | 10/26/1999 | INTERPOSER WITH EMBEDDED CIRCUITRY AND METHOD FOR USING THE SAME TO PACKAGE MICROELECTRONIC UNITS |

-continued

| U.S. PAT. NO.: | INVENTOR: | ISSUE DATE | TITLE: |
|---|---|---|---|
| 5,905,633 | Shim et al. | 05/18/1999 | BALL GRID ARRAY SEMICONDUCTOR PACKAGE USING A METAL CARRIER RING AS A HEAT SPREADER |
| 5,893,724 | Chakravorty et al. | 04/13/1999 | METHOD FOR FORMING A HIGHLY RELIABLE AND PLANAR BALL GRID ARRAY PACKAGE |
| 5,892,290 | Chakravorty et al. | 04/06/1999 | HIGHLY RELIABLE AND PLANAR BALL GRID ARRAY PACKAGE |
| 5,880,921 | Tham et al. | 03/09/1999 | MONOLITHICALLY INTEGRATED SWITCHED CAPACITOR BANK USING MICRO ELECTRO MECHANICAL SYSTEM (MEMS) TECHNOLOGY |
| 5,872,399 | Lee | 02/16/1999 | SOLDER BALL LAND METAL STRUCTURE OF BALL GRID SEMICONDUCTOR PACKAGE |
| 5,864,470 | Shim et al. | 01/26/1999 | FLEXIBLE CIRCUIT BOARD FOR BALL GRID ARRAY SEMICONDUCTOR PACKAGE |
| 5,855,323 | Yost et al. | 01/05/1999 | METHOD AND APPARATUS FOR JETTING, MANUFACTURING AND ATTACHING UNIFORM SOLDER BALLS |
| 5,821,827 | Mohwinkel et al. | 10/13/1998 | COPLANAR OSCILLATOR CIRCUIT STRUCTURES |
| 5,787,580 | Woo | 08/04/1998 | METHOD FOR MAKING RADIO-FREQUENCY MODULE BY BALL GRID ARRAY PACKAGE |
| 5,724,728 | Bond et al. | 03/10/1998 | METHOD OF MOUNTING AN INTEGRATED CIRCUIT TO A MOUNTING SURFACE |
| 5,717,245 | Pedder | 02/10/1998 | BALL GRID ARRAY ARRANGEMENT |
| 5,642,265 | Bond et al. | 06/24/1997 | BALL GRID ARRAY PACKAGE WITH DETACHABLE MODULE |
| 5,641,113 | Somaki et al. | 06/24/1997 | METHOD FOR FABRICATING AN ELECTRONIC DEVICE HAVING SOLDER JOINTS |
| 5,637,832 | Danner | 06/10/1997 | SOLDER BALL ARRAY AND METHOD OF PREPARATION |
| 5,594,275 | Kwon et al. | 01/14/1997 | J-LEADED SEMICONDUCTOR PACKAGE HAVING A PLURALITY OF STACKED BALL GRID ARRAY PACKAGES |
| 5,583,359 | Ng et al. | 12/10/1996 | CAPACITOR STRUCTURE FOR AN INTEGRATED CIRCUIT |
| 5,519,580 | Natarajan et al. | 05/21/1996 | METHOD OF CONTROLLING SOLDER BALL SIZE OF BGA IC COMPONENTS |
| 5,516,030 | Denton | 05/14/1996 | METHOD AND APPARATUS FOR ASSEMBLING BALL GRID ARRAY COMPONENTS ON PRINTED CIRCUIT BOARDS BY REFLOWING BEFORE PLACEMENT |
| 5,504,277 | Danner | 04/02/1996 | SOLDER BALL ARRAY |
| 5,442,852 | Danner | 08/22/1995 | METHOD OF FABRICATING SOLDER BALL ARRAY |
| 4,866,567 | Crafts et al. | 09/12/1989 | HIGH FREQUENCY INTEGRATED CIRCUIT CHANNEL CAPACITOR |
| 4,409,608 | Yoder | 10/11/1983 | RECESSED INTERDIGITATED INTEGRATED CAPACITOR |

The disclosures of all of the foregoing United States patents are hereby fully incorporated into this application by reference thereto.

BRIEF SUMMARY OF THE INVENTION

In view of the discussed drawbacks and other shortcomings encountered in the prior art, and recognized and addressed by the present invention, improved low inductance capacitor technology has been developed. Thus, broadly speaking, a general object of the presently disclosed technology is improved termination schemes for multilayer capacitor arrays.

It is another general object of the present subject matter to provide a low inductance capacitor array that facilitates closer component spacing in an integrated circuit environment.

It is a principal object of the present subject matter to provide capacitor array technology that is compatible with both land grid array and area grid array packaging configurations.

It is another principal object of the present subject matter to provide a multilayer capacitor array with lowered equivalent series inductance (ESL).

It is another object of the present subject matter to provide capacitors with interdigitated electrode configurations that may define a single capacitor or a capacitor array.

It is a further object of the present subject matter to provide improved termination features and arrangements for multilayer IDCs without decrease in the volumetric efficiency or potential capacitance of such capacitor configurations.

Yet another object of the presently disclosed technology is to provide termination features that effect a stress-absorbing standoff and offer additional forgiveness in differential thermal coefficient of expansion (TCE) and thermal shock.

Additional objects and advantages of the disclosed technology are set forth in, or will be apparent to those of ordinary skill in the art from, the detailed description herein. Also, it should be further appreciated that modifications and variations a to the specifically illustrated, referenced and discussed features hereof may be practiced in various embodiments and uses of this invention without departing from the spirit and scope thereof, by virtue of present reference thereto. Such variations may include, but are not limited to, substitution of equivalent means and features for those illustrated, referenced or discussed, and the functional, operational or positional reversal of various parts, features or the like.

Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description). One exemplary such embodiment of the present subject matter relates to a multilayer capacitor. Such capacitive element may comprise a body of dielectric material, a plurality of electrode layers with correpsonding electrode tabs, a plurality of termination lands and portions of solder-stop material.

More preferably, such exemplary dielectric layers and electrode layers are interleaved to form a multilayer configuration. Electrode tabs may extend from certain electrode layers in a predefined manner to form an interdigitated capacitor arrangement. The termination lands are preferably connected to exposed portions of the electrode tabs, and solder elements may be placed on selected portions of the termination lands. A solder-stop is preferably applied to selected sides of the capacitor to effect limited flow of the solder elements. "Solder-stop" or "solder-masking" materials are well known in the industry, and may consist of organic or inorganic materials, which are applied as a liquid or tape-like material, and either cured or fired in place to inhibit the flow of molten solder during subsequent reflow processes.

Another present exemplary embodiment of the present subject matter concerns such a multilayer capacitor as described above for use as a capacitor array. Such capacitor array may preferably be configured for use with either ball land grid array or area grid array packaging techniques. More preferably, such an array configuration may comprise a multilayer arrangement of dielectric and electrode layers, electrode tabs extending from selected electrode layers, termination lands connected to exposed portions of the electrode tabs and solder stop applied along selected sides of the capacitor. The termination lands preferably wrap onto top and bottom surfaces of the multilayer arrangement, upon which solder balls may thereafter be placed. Predefined portions of solder-stop accordingly limit the placement and reflow of the solder balls.

Yet another present exemplary embodiment of the subject technology corresponds to a multilayer electronic component. Such electronic component preferably includes a generally rectangular body characterized by first and second opposing end surfaces, first and second peripheral terminations, and at least one layer of solder stop. The first peripheral termination is preferably applied to the first end surface and the second peripheral termination is preferably applied to the second end surface. Solder stop is then applied to at least one side of the rectangular body, and preferably covers portions of at least one of the peripheral terminations such that a solder limiting metallurgy is effected.

Still further exemplary embodiments of the present subject matter involve various combinations of selected of the foregoing features, wherein selected of the exemplary electrode layers are subdivided to provide multiple discrete capacitive elements. This optional feature in the disclosed embodiments facilitates the versatile design choice to create either a single multilayer capacitor or a multilayer capacitor array. When used in conjunction with single multilayer capacitors, the disclosed termination improvements help prevent "tomb-stoning," a phenomena where the high surface tension of molten solder can act on the end surface of the capacitor, causing it to stand up on its end and thereby resulting in a failed operation.

Additional embodiments of the subject invention, not necessarily expressed in this summarized section, may include and incorporate various combinations of aspects of features or parts referenced in the summarized objectives above, and/or other features, parts, or elements as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
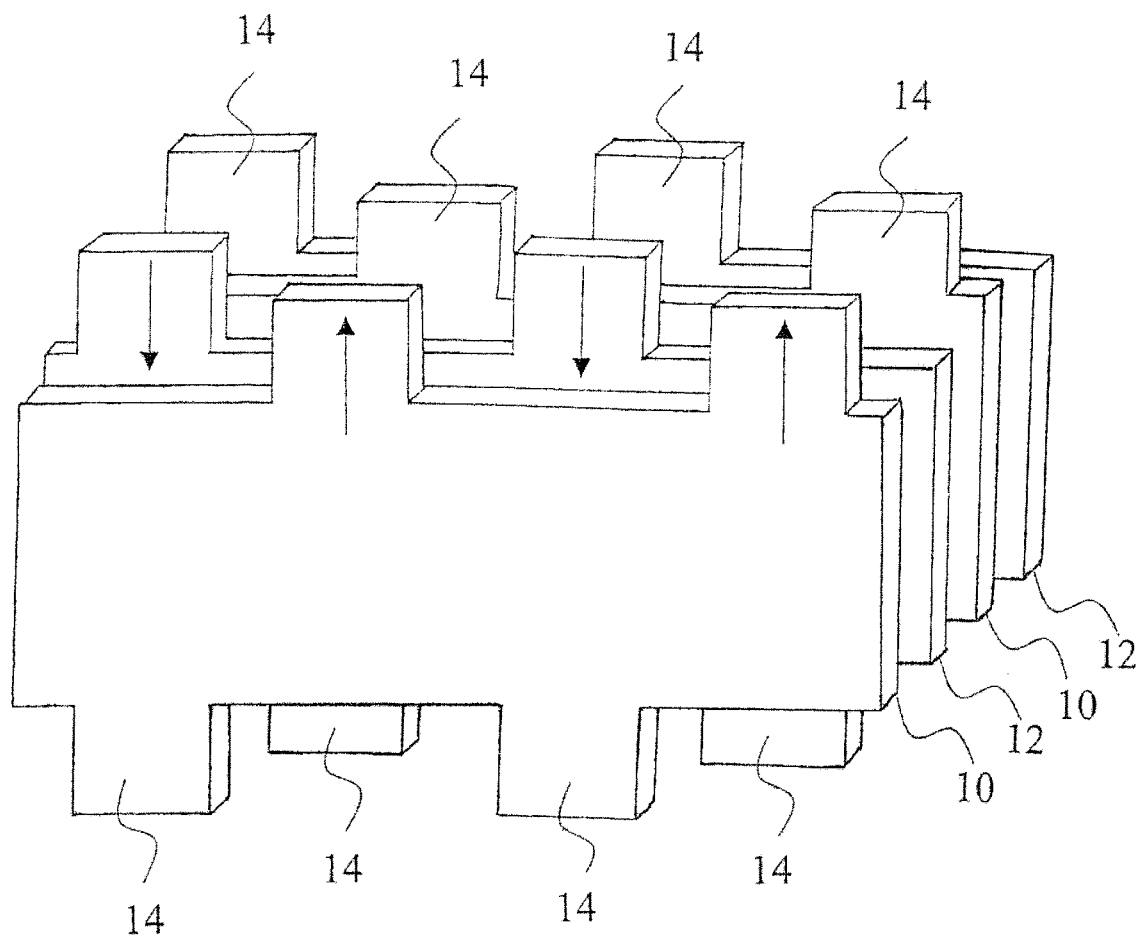
FIG. 1 illustrates a partially perspective view of an exemplary electrode layer configuration (partially exploded) for use in a multilayer interdigitated capacitor in accordance with present subject matter.

Repeat use of reference characters throughout the present specification and appended drawings is intended to represent same or analogous features or elements of the subject invention. Also, it should be appreciated that certain elements or features of the drawings may not be drawn to scale or in dimensional proportion to other elements or features of the drawings.

DETAILED DESCRIPTION OF THE DRAWINGS

Figure 2A:
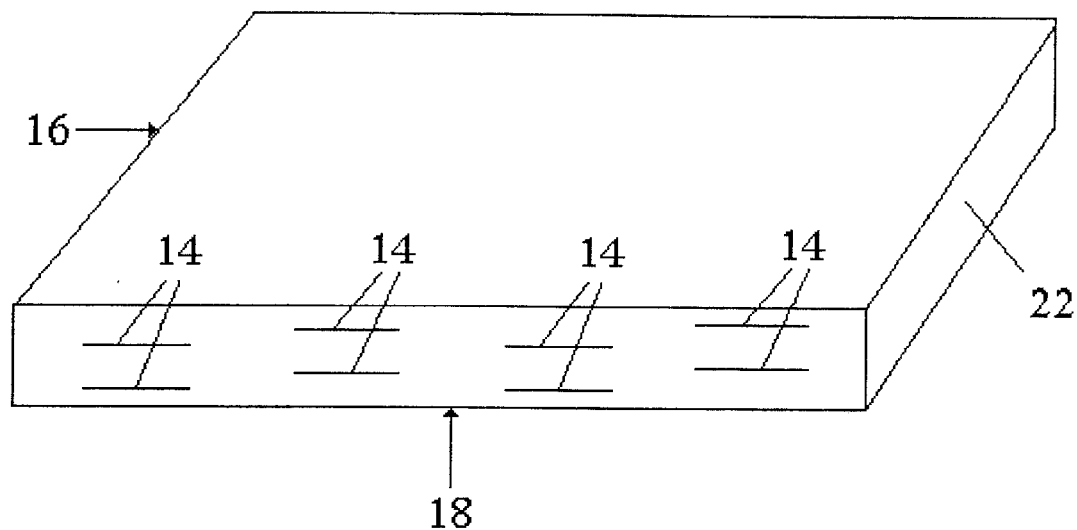
FIG. 2A illustrates an exemplary capacitor embodiment of electrode layers and corresponding tabs disposed within a body of dielectric material in accordance with present subject matter.
Figure 2B:
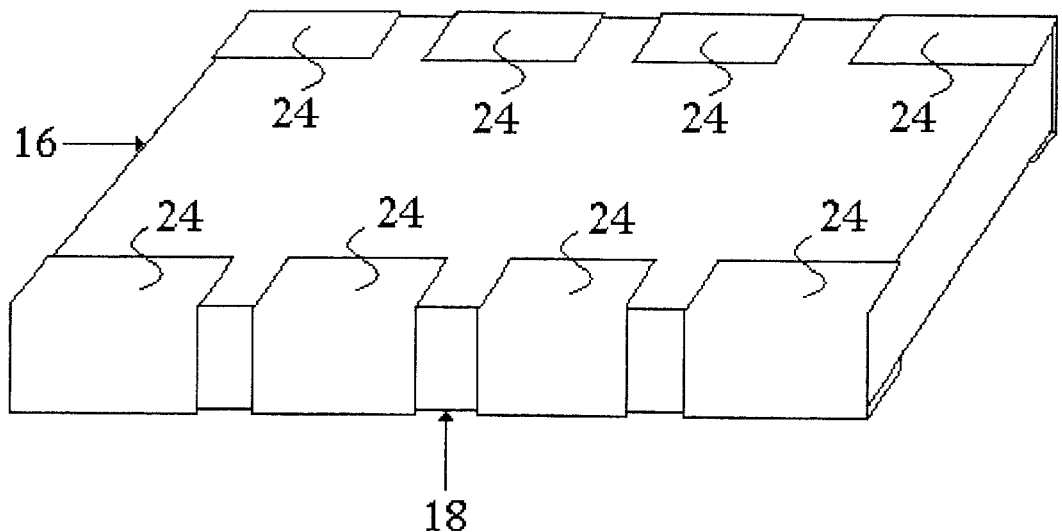
FIG. 2B illustrates an exemplary capacitor embodiment, such as that displayed in FIG. 2A, with termination lands in accordance with the present subject matter.

As referenced in the Brief Summary of the Invention section, supra, the present subject matter is particularly concerned with multilayer capacitors with improved termination schemes. Aspects of several exemplary configurations that are utilized in part in typical capacitor technology are represented in FIGS. 1, 2A and 2B. All such figures are discussed in the present specification in the context of the present subject matter. FIGS. 3A, 3B, 5, 6A, 6B and 6C all represent improvements over conventional capacitor configurations, yielding exemplary embodiments of the present subject matter. Additional distinguishing features of exemplary embodiments of the subject matter are discussed relative to FIGS. 4A and 4B.

It should be noted that each of the exemplary embodiments should not insinuate limitations of the invention. Features illustrated or described as part of one embodiment may be used in combination with another embodiment to yield yet further embodiments. Additionally, certain features may be interchanged with similar devices or features though not expressly mentioned which perform the same or similar function(s).

Reference will now be made in detail to the presently preferred embodiments of the present subject matter. Referring to the drawings, FIG. 1 illustrates an exemplary configuration of a plurality of electrode layers 10 and 12 and of a plurality of electrode tabs 14 for use in a multilayer capacitor or capacitor array. Electrode layers 10 and 12 are arranged in a generally parallel fashion with tabs extending from the layers such that electrode tabs extending from alternating electrode layers are aligned in respective columns. Such exemplary configuration yields an interdigitated arrangement of electrode layers as potentially applicable for use in some embodiments of the present subject matter.

The exemplary illustration of FIG. 1 depicts a total of four such electrode layers 10 and 12 with corresponding tabs 14, but typical arrangements as utilized in conjunction with the present subject matter may vary and may often contain many more electrode layers and/or respective tabs. Such feature provides the design option of creating capacitive elements with a large range of capacitance values (by choosing the number and size of electrodes).

The arrangement as depicted in FIG. 1 provides an electrode configuration with generally low equivalent series inductance (ESL). Both the self and mutual inductance of the element are generally lowered due to the exemplary interdigitated electrode configuration. Current flows in such exemplary capacitor plates are referenced by up arrows (unnumbered) and down arrows (unnumbered), where the up arrows display the direction of current flow in alternating electrode layers 10, and the down arrows display the direction of current flow in electrode layers 12 that are displaced between the defined alternating layers 10. Since the current does not have to travel the entire length of both electrodes to complete the circuit, self inductance of the device is lowered.

Adjacent layers in the exemplary arrangement of FIG. 1 may be thought of schematically as positive and negative plates. The electrode arrangement is such that the current flowing out of a positive plate 10 returns in the opposite direction along an adjacent negative plate 12. Such provision of current flows in opposing directions eliminates any mutual inductance created by adjacent current flow in the same direction.

FIGS. 2A, 2B, 3A and 3B display various features as incorporated with an exemplary multilayer capacitor in accordance with the subject matter to effect the presently disclosed capacitor termination arrangement. FIG. 2A displays an exemplary interdigitated capacitor (IDC) 20 with electrode plates such as those in FIG. 1 disposed in a body of dielectric material 22. IDC 20 may be alternatively described as a multilayer arrangement of electrode layers 10, 12 interleaved with a plurality of dielectric layers. Dielectric material 22 preferably encompasses all portions of electrode layers 10 and 12 except for portions of tabs 14 that are exposed along sides of the capacitor configuration 20.

In the best mode (or preferred embodiments) of the present subject matter, the electrode layers 10 and 12 may typically be comprised of platinum, nickel, a palladium-silver alloy, or other suitable elements or combinations of elements. A dielectric material typically used may be barium titanate or other suitable dielectric. Suitable dielectrics are often utilized such that maximum capacitance is delivered at temperatures somewhere above room temperature (often around 60° C.).

Termination lands 24 are then applied to the periphery of IDC 20 in order to connect to the exposed portions of electrode tabs 14. Electrode tabs 14 are typically aligned in interdigitated columns; the exemplary embodiment of FIG. 2A is characterized by two sets of four tab columns. Only four of such tab columns are visible from the view of FIG. 2A. Typically, the number of tab columns may thus correspond to the number of termination lands 24 needed to connect to all exposed portions of electrode tabs 14. The eight termination lands 24 as displayed in FIG. 2B wrap around selected sides of IDC 20 such that a portion of each land is located of topmost and bottommost layers of the capacitor 20. It is also apparent from FIG. 2B that a preference is to have the peripheral lands 24 wrap along the longer sides 18 of the exemplary IDC as opposed to the shorter side 16. The subsequent termination scheme formed along the capacitor chip 20 is along the longer side 18 of the capacitor chip. As opposed to terminating along the shorter side 16 of chip 20, the configuration of the present subject matter provides a shorter distance for the current path, creating lower ESL. Typical dimensions for such shorter sides 16 and longer sides 18, respectively, of chip 20 may be about 60×120 mils (thousandths of an inch) or about 50×80 mils. In some embodiments of the present subject matter, different dimensions may be practiced, as will be readily understood by those of ordinary skill in the art.

Figure 3A:
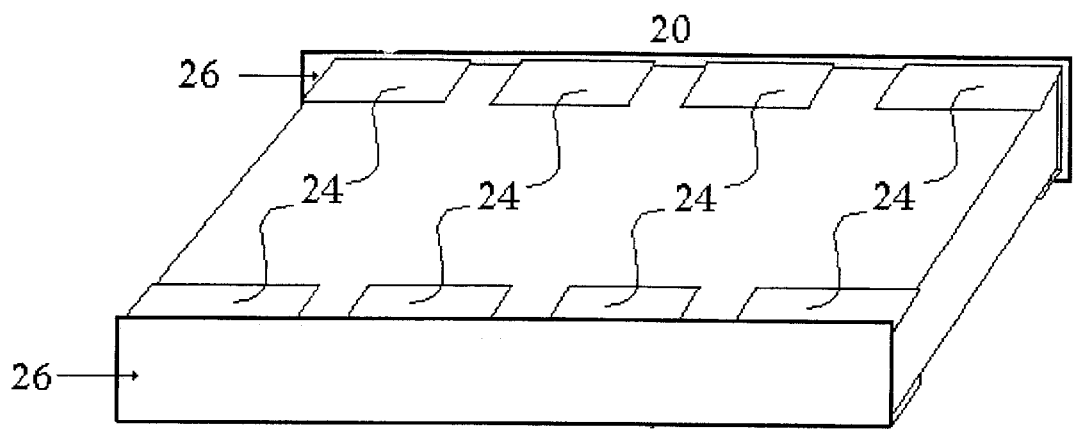
FIG. 3A illustrates an exemplary capacitor embodiment of the present invention in accordance with disclosed solder-stop features.

The next step in effecting the termination arrangement of the present subject matter is by coating the longer sides 18 of IDC 20 with a solder stop material 26, as in FIG. 3A. Exemplary substances for use as solder-stop 26 include glass or other suitable organic material. By coating the edges of IDC 20 with a solder-stop, a ball limiting metallurgy is effected for the top and bottom surfaces of IDC 20.

Figure 3B:
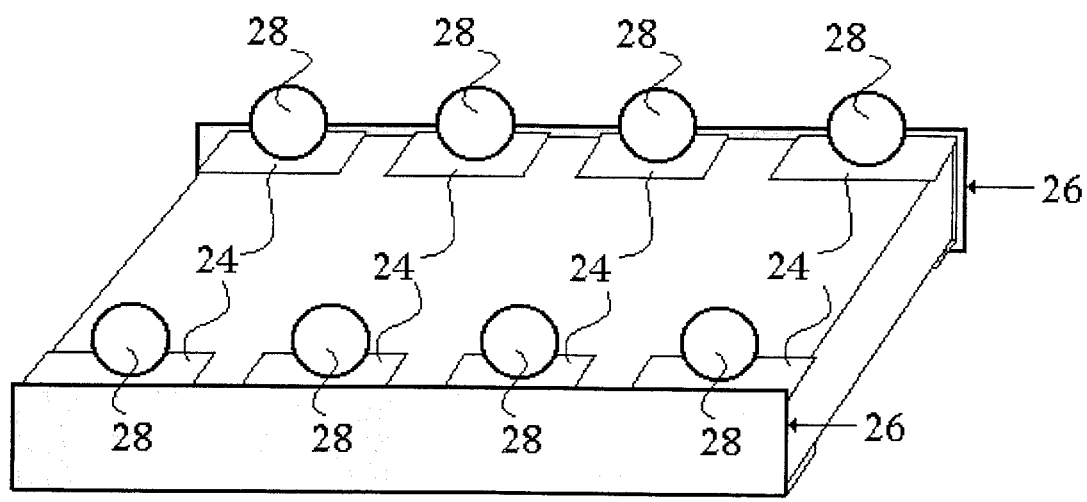
FIG. 3B displays an exemplary capacitor embodiment of the presently disclosed technology, such as that in FIG. 3A, with the addition of solder element terminations.

After the provision of solder-stop material 26, solder elements 28 may then be applied as in FIG. 3B to form a low inductance BGA package. The solder elements 28 may typically comprise solder balls, which may have a typical dimension of about 10–15 mils (though other sizes may be practiced, as understood in the art). Additional implementation of such ball grid array packaging techniques may incorporate the distribution of solder preforms over an entire surface of a capacitor chip 20. Solder balls 28 may be distributed over the top surface, bottom surface, or both surfaces of the capacitive element in accordance with present termination and mounting technologies.

Once the solder preforms 28 are reflowed, a columnar element of solder is formed. These solder elements serve to both mount the capacitor 20 and serve as a stress absorbing standoff. Such termination arrangement generally corresponds to the provision of external vias formed along sides of the capacitor structure 20. Since no internal vias are required, volumetric efficiency and maximum capacitance of the structure is maintained. Once the capacitive element of FIG. 3B is formed (and assembled with solder elements 28), chip 20 is mountable without the use of additional solder. Since fine solder traces are often difficult to form, it is quite advantageous that with such a device, one can simply place chip 20 onto a board and then perform solder reflow to complete assembly. It is preferred to provide a variety of solder ball compositions to meet varied customer needs and preferences. Such design flexibility allows for low-fire or high-fire solder reflow operations, as understood by those of ordinary skill in the art without more detailed explanation.

The chip design of FIG. 3A is not only compatible with land grid array packaging as illustrated in FIG. 3B, but is also compatible with area grid array packaging. Different packaging and termination configurations may be more suitable for some applications than others, as should be readily appreciated by those of ordinary skill in the art.

Figure 4A:
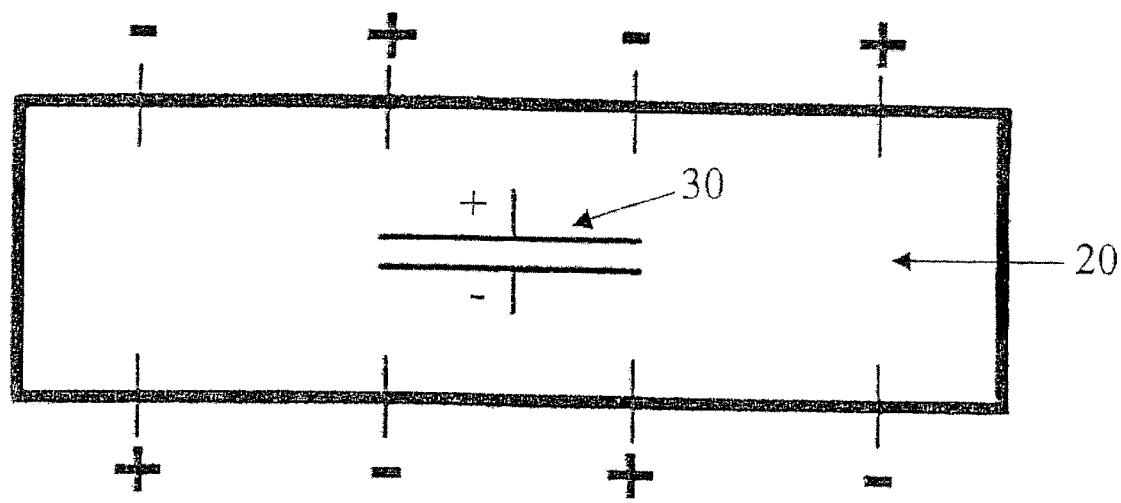
FIG. 4A illustrates a schematic circuit representation of an exemplary capacitor with multiple terminations in accordance with present subject matter.
Figure 4B:
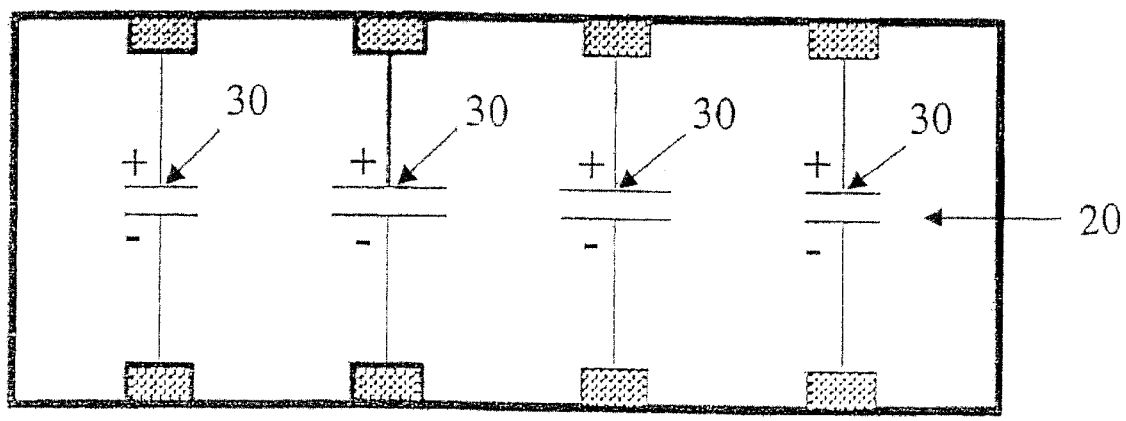
FIG. 4B illustrates a schematic circuit representation of an exemplary capacitor array, comprised of multiple discrete capacitors in a single component in accordance with present subject matter.

Another design option in implementing various embodiments of the present subject matter is whether or not single or multiple capacitors 30 are desired. FIGS. 4A and 4B represent exemplary schematics of such two options, respectively.

As referenced in the above exemplary embodiments, electrode layers 10 and 12 may provide for a single interdigitated capacitor (IDC) 30 with multiple terminations, such as the exemplary embodiment represented in present FIG. 4A. However, such arrangement may be modified, in accordance with broader aspects of the present subject matter, so as to obtain exemplary embodiments such as the element modeled in present FIG. 4B. In accordance with the present disclosure, external features of the earlier referenced chip configuration are maintained while the electrodes 10 and 12 are internally subdivided. FIG. 4B represents that such modifications yield multiple discrete capacitors 30, or a capacitor array. Thus, the termination scheme of the present subject matter may be implemented in accordance with IDC's or with integrated passive components (IPC's).

Figure 5:
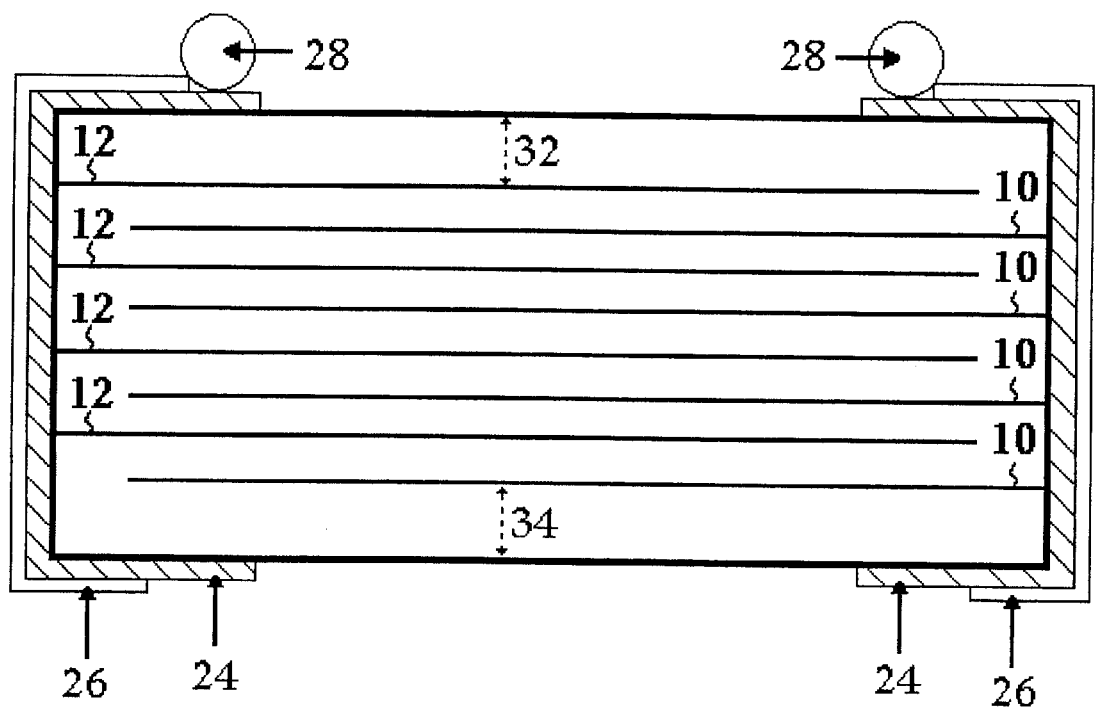
FIG. 5 illustrates a generally side view of an exemplary configuration of, and termination scheme for, multilayer capacitor embodiments in accordance with present subject matter.

A generally side view of an exemplary multilayer capacitor termination scheme in accordance with the disclosed technology is displayed in FIG. 5. Alternating electrode layers 10 and 12 are disposed in a chip body and portions of these electrodes may preferably be exposed on selected sides of chip 20. In such a typical capacitor configuration as that illustrated in FIG. 5, cover layers of a minimum thickness are required in order to withstand certain stresses caused in the manufacturing process. The existence of such top layer of thickness 32 and bottom layer with thickness 34 combined with the termination scheme of FIG. 5 adds more equivalent series inductance to such a capacitor device, specifically by increasing the loop path inductance. Embodiments in accordance with present subject matter allow for reduction of such top and bottom cover layers. Once again, this potential difference would yield a capacitor configuration with much smaller ESL.

Figure 6A:
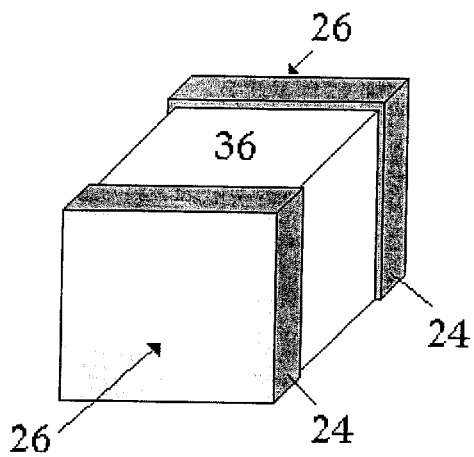
FIGS. 6A through 6C, respectively, illustrate exemplary embodiments of a multilayer capacitor with varied termination features in accordance with the disclosed technology.
Figure 6B:
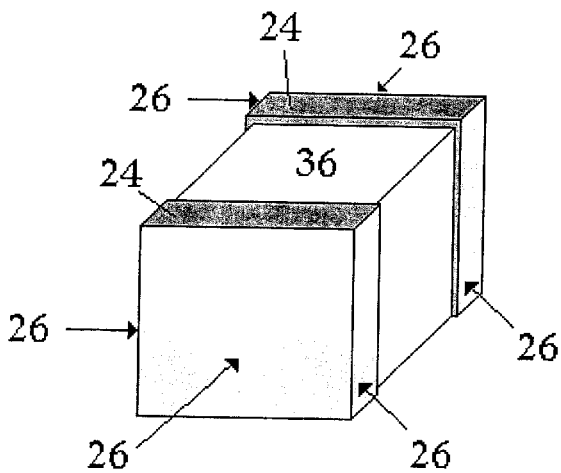
Figure 6C:
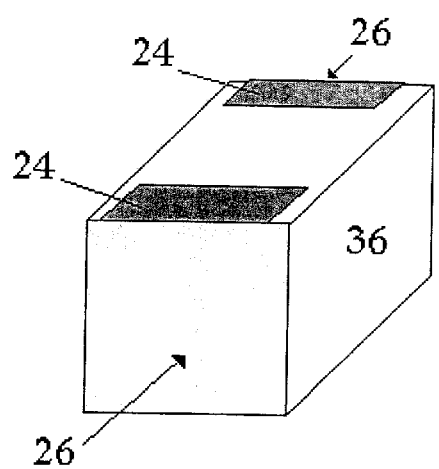

Several more particular exemplary arrangements of terminations and solder-stop material may be implemented in accordance with multilayer capacitors (MLCs). A general MLC chip body 36 is illustrated in FIGS. 6A, 6B and 6C with varied termination schemes. Although the MLCs 36 displayed herein are represented by simple chip configurations, their internal configurations can be modeled as similar to the exemplary IDC cross-sectional view of FIG. 5.

Opposing peripheral terminations 24, as illustrated in FIGS. 6A and 6B, can respectively cover an entire end surface of an MLC 36, while extending to each of the four surfaces adjacent to each respective end surface. In this exemplary six-sided MLC, each peripheral termination thus covers portions of five surfaces of an MLC 36. In accordance with the formation of peripheral terminations as in FIGS. 6A and 6B, solder stop 26 corresponding to a single peripheral termination can then preferably be applied to either one surface (as in FIG. 6A) or to three surfaces (as in FIG. 6B). The choice of solder stop configuration is then preferably utilized in a similar fashion on the opposing termination 24 in each exemplary MLC embodiment. Each of these respective exemplary configurations provides limiting metallurgy as previously described in accordance with the present technology.

The exemplary configuration presented in FIG. 6C somewhat parallels the termination and solder mask features of the exemplary embodiment displayed in FIG. 3A. A termination land 24 extends across an end surface of MLC 36 and then to two selected opposing surfaces adjacent to the end surface. Thus, each of the two exemplary peripheral terminations 24 of FIG. 6C cover portions of three surfaces of exemplary MLC chip body 36. In accordance with this exemplary configuration, solder stop 26 is then preferably applied only to each respective end surface, such as in FIGS. 6A and 6C. Any combination of the termination features 24 and solder stop 26 of FIGS. 6A, 6B and 6C could be utilized to form additional exemplary embodiments of the subject technology.

The various embodiments of the present subject matter as described in the above specification include many flexible design options. These may include selection of the type of grid array packaging, designation of the number of discrete capacitors 30, and selection of a preference for the solder ball 28 composition. An embodiment characterized by any combination of such choices may still be combined with the low inductance termination scheme of the present subject matter. Any of such combinations yield low inductance capacitors at relatively low cost for use in any high frequency application requiring decoupling capacitors.

While the present subject matter has been described in detail with respect to specific embodiments thereof, it will be appreciated that those skilled in the art, upon attaining an understanding of the foregoing may readily conceive of alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art, the scope of the present subject matter being set forth in the appended claims.

What is claimed is:

1. A multilayer capacitor, comprising:
    a body of dielectric material;
    a plurality of electrode layers disposed in said body of dielectric material;
    a plurality of electrode tabs extending from selected of said electrode layers and exposed on selected sides of said body of dielectric material;
    a plurality of termination lands positioned on the periphery of said body of dielectric material and connected to exposed portions of selected of said plurality of electrode tabs; and
    at least one body of solder-stop applied to selected sides of said multilayer capacitor.

2. A multilayer capacitor as in claim 1, further comprising a plurality of solder elements reflowed and connected to selected portions of said plurality of termination lands, wherein the flow of solder is contained in a predetermined fashion as a result of said solder-stop.

3. A multilayer capacitor as in claim 1, wherein said plurality of electrode tabs are arranged such that selected electrode tabs extending from alternating electrode layers are aligned in respective columns, forming an interdigitated capacitor element.

4. A multilayer capacitor as in claim 2, wherein said body of dielectric material is characterized by a top surface and a bottom surface, and wherein said electrode layers are disposed in said dielectric body such that each said electrode layer is oriented generally parallel with said top surface and said bottom surface.

5. A multilayer capacitor as in claim 4, wherein portions of each of said termination lands are located on said top surface and said bottom surface of said body of dielectric material, forming a top set of land portions and a bottom set of land portions.

6. A multilayer capacitor as in claim 5, wherein said solder elements are connected to selected of said top set of land portions and said bottom set of land portions.

7. A multilayer capacitor as in claim 2, wherein said solder elements may be composed of preselected suitably conductive materials within a range of different melting points, thereby facilitating varied firing conditions.

8. A multilayer capacitor as in claim 1, wherein selected of said plurality of electrode layers are subdivided to provide a capacitor array of multiple discrete capacitive elements.

9. A multilayer capacitor incorporating selected of land grid array and area grid array termination features, comprising:
- a plurality of electrode layers, each of said electrode layers characterized by a first and second side;
- a plurality of dielectric layers wherein selected of said dielectric layers are arranged on both first and second sides of each of said electrode layers, forming a multilayer arrangement of alternating dielectric and electrode layers such that said multilayer arrangement is characterized by a topmost dielectric layer and a bottommost dielectric layer;
- a plurality of electrode tabs extending from selected of said electrode layers and exposed along selected sides of said multilayer arrangement;
- a plurality of termination lands located on the periphery of said multilayer arrangement and extending from said topmost dielectric layer along selected sides of said multilayer arrangement to said bottommost dielectric layer, and wherein said termination lands are connected to selected exposed portions of said electrode tabs; and
- solder-stop applied along selected sides of said multilayer arrangement and applied over selected portions of said plurality of termination lands.

10. A multilayer capacitor as in claim 9, further comprising a plurality of solder preforms located on selected of said topmost dielectric layer and said bottommost dielectric layer of said multilayer capacitor and connected to selected portions of said termination lands.

11. A multilayer capacitor as in claim 10, wherein said solder preforms are reflowed to effect respective solder columns for mounting said multilayer capacitor and wherein the flow of solder is limited accordingly by the provision and placement of said solder-stop.

12. A multilayer capacitor as in claim 10, wherein said plurality of electrode tabs are arranged such that selected electrode tabs extending from alternating electrode layers are aligned in respective columns, forming an interdigitated capacitor element.

13. A multilayer capacitor as in claim 10, wherein said solder performs may be composed of preselected conductive materials within a range of different melting points, thereby facilitating varied firing conditions.

14. A multilayer capacitor as in claim 10, wherein selected of said electrode layers are subdivided to provide a capacitor array of multiple discrete capacitive elements.

15. A multilayer capacitor as in claim 10, wherein the thickness of said topmost dielectric layer and the thickness of said bottommost dielectric layer are minimized to reduce the overall inductance of said multilayer capacitor.

16. A multilayer capacitor array with low inductance terminations, comprising:
- a plurality of dielectric layers;
- a plurality of electrode layers, interleaved with selected of said dielectric layers to form a multilayered arrangement, said multilayered arrangement having a defined top surface, a defined bottom surface, and a plurality of side surfaces;
- a plurality of electrode tabs extending from selected of said electrode layers and exposed on selected side surfaces of said multilayered arrangement;
- a plurality of termination lands connected to the periphery of said multilayered arrangement, connected to selected exposed portions of said electrode tabs, and extending onto selected of said topmost and bottommost layers of said multilayered arrangement;
- solder-stop applied to selected sides of said multilayered arrangement and applied over portions of said termination lands, thereby effecting a ball limiting metallurgy on said topmost and bottommost surfaces of said multilayered arrangement; and
- a plurality of solder elements attached to selected portions of said termination lands on selected of said topmost and said bottommost layers of said multilayer arrangement.

17. A multilayer capacitor array as in claim 16, wherein said plurality of electrode tabs are arranged such that selected electrode tabs extending from alternating electrode layers are aligned in respective columns, forming an interdigitated capacitor element.

18. A multilayer capacitor array as in claim 16, wherein said plurality of solder elements may be comprised of preselected conductive materials within a range of different melting points, thereby facilitating varied firing conditions.

19. A multilayer capacitor array as in claim 16, wherein said plurality of side surfaces comprises a pair of longer sides and a pair of shorter sides and wherein said solder-stop is applied along each side in said pair of longer sides.

20. A multilayer electronic component, comprising:
- a generally rectangular body characterized by first and second opposing end surfaces;
- a first peripheral termination applied to said first end surface and covering a selected portion thereof;
- a second peripheral termination applied to said second end surface and covering a selected portion thereof; and
- at least one layer of solder stop applied to selected sides of said generally rectangular body and covering portions of selected one of said first peripheral termination and said second peripheral termination.

21. A multilayer electronic component as in claim 20, wherein said first peripheral termination covers a majority of said first end surface and extends to at least two other adjacent sides of said generally rectangular body, and wherein said second peripheral termination covers a majority of said second end surface and extends to at least two other adjacent surfaces of said generally rectangular body.

22. A multilayer electronic component as in claim 21, wherein said layer of solder stop generally covers said first end surface and any portions of said first peripheral termination thereon, and wherein said multilayer electronic component further comprises a second layer of solder stop generally covering said second end surface and any portions of said second peripheral termination thereon.

23. A multilayer electronic component as in claim 20, wherein said first peripheral termination completely covers said first end surface and extends to portions of each surface of said generally rectangular body adjacent to said first end surface, and wherein said second peripheral termination completely covers said second end surface and extends to portions of each surface of said generally rectangular body adjacent to said second end surface.

24. A multilayer electronic component as in claim 23, wherein said layer of solder stop generally covers said first end surface and portions of said first peripheral termination thereon, and wherein said multilayer electronic component further comprises a second layer of solder stop generally covering said second end surface and portions of said second peripheral termination thereon.

25. A multilayer electronic component as in claim 24, wherein said layer of solder stop covering said first end surface extends to at least two other surfaces of said generally rectangular body adjacent to said first end surface, covering portions of said first peripheral termination thereon, and wherein said second peripheral termination covering said second end surface extends to at least two other surfaces of said generally rectangular body adjacent to said second end surface, covering portions of said second peripheral termination thereon.

26. A multilayer electronic component as in claim 25, further comprising a plurality of solder preforms connected to selected portions of said first and second peripheral terminations, wherein the reflow of said solder preforms is limited and contained by the respective layers of solder stop.

27. A multilayer electronic component as in claim 26, wherein said plurality of solder preforms are arranged in either a land grid array configuration or an area grid array configuration.

28. A multilayer electronic component as in claim 22, further comprising a plurality of solder preforms connected to selected portions of said first and second peripheral terminations, wherein the reflow of said solder preforms is limited and contained by the respective layers of solder stop.

29. A multilayer electronic component as in claim 28, wherein said plurality of solder preforms are arranged in either a land grid array configuration or an area grid array configuration.

* * * * *